(12) United States Patent
Chang

(10) Patent No.: US 11,276,671 B2
(45) Date of Patent: Mar. 15, 2022

(54) MULTILAYERED MEMORY DEVICE WITH THROUGH-SILICON VIA(TSV), SEMICONDUCTOR DEVICE AND METHOD FOR MANUFACTURING THE SAME

(71) Applicant: Changxin Memory Technologies, Inc., Anhui (CN)

(72) Inventor: Chih-Wei Chang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/102,104

(22) Filed: Nov. 23, 2020

(65) Prior Publication Data

US 2021/0074685 A1 Mar. 11, 2021

Related U.S. Application Data

(63) Continuation of application No. PCT/CN2019/103363, filed on Aug. 29, 2019.

(30) Foreign Application Priority Data

Aug. 31, 2018 (CN) .......................... 201811015659.9
Aug. 31, 2018 (CN) .......................... 201821428686.4

(51) Int. Cl.
| | |
|---|---|
| *H01L 25/065* | (2006.01) |
| *H01L 21/768* | (2006.01) |
| *H01L 23/48* | (2006.01) |
| *H01L 23/00* | (2006.01) |
| *H01L 25/00* | (2006.01) |

(52) U.S. Cl.
CPC .... *H01L 25/0657* (2013.01); *H01L 21/76898* (2013.01); *H01L 23/481* (2013.01);
(Continued)

(58) Field of Classification Search
CPC .......... H01L 25/0657; H01L 21/76898; H01L 23/481; H01L 24/05; H01L 24/08;
(Continued)

(56) References Cited

U.S. PATENT DOCUMENTS 10,290,559 B2 * 5/2019 Lin .......................... H01L 24/14
2005/0269680 A1 * 12/2005 Hsuan ................. H01L 21/6835
257/686

(Continued)

FOREIGN PATENT DOCUMENTS

| CN | 102456673 A | * | 5/2012 |
| CN | 208655619 U | | 3/2019 |

OTHER PUBLICATIONS

PCT International Search Report and the Written Opinion dated Nov. 28, 2019, issued in related International Application No. PCT/CN2019/103363 (8 pages).

*Primary Examiner* — Mamadou L Diallo

(74) *Attorney, Agent, or Firm* — Sheppard Mullin Richter & Hampton LLP

(57) ABSTRACT

A memory device, a semiconductor device and their manufacturing methods are provided. One of the methods may include: providing a first die and a plurality of second dies, the first die having a first pad, each of the plurality of second dies having a second pad; stacking the plurality of second dies on the first die, the second pads and the first pad arranged in a stepwise manner, and projections of the second pads of any two adjacent second dies on the first die partially overlapped; forming a connecting hole passing through the second dies; and forming a conductive body filling the connecting hole and connecting the first pad and the second pads. This method simplifies the manufacturing process of a semiconductor device, reduces the cost thereof, and improves the production yield.

20 Claims, 8 Drawing Sheets

(52) U.S. Cl.
CPC ............ *H01L 24/05* (2013.01); *H01L 24/08* (2013.01); *H01L 25/50* (2013.01); *H01L 2224/05124* (2013.01); *H01L 2224/05147* (2013.01); *H01L 2224/05184* (2013.01); *H01L 2224/08146* (2013.01); *H01L 2225/06544* (2013.01); *H01L 2924/1436* (2013.01)

(58) Field of Classification Search
CPC ........... H01L 25/50; H01L 2224/05124; H01L 2224/05147; H01L 2224/05184; H01L 2224/08146; H01L 2225/06544; H01L 2924/1436; H01L 2225/06541; H01L 2224/25174; H01L 24/82; H01L 24/25; H01L 24/24; H01L 2224/82106; H01L 2224/24146; H01L 2224/24011; H01L 2224/24051; H01L 2224/08145
See application file for complete search history.

(56) References Cited

U.S. PATENT DOCUMENTS

| | | |
|---|---|---|
| 2009/0014891 A1 | 1/2009 | Chang et al. |
| 2009/0267194 A1 | 10/2009 | Chen |
| 2009/0321954 A1* | 12/2009 | Oh ...................... H01L 25/0657 257/777 |
| 2010/0285635 A1 | 11/2010 | Jo et al. |
| 2013/0307160 A1* | 11/2013 | Farooq ................... H01L 24/09 257/774 |
| 2014/0070395 A1* | 3/2014 | Chen ...................... H01L 21/56 257/698 |
| 2015/0024552 A1 | 1/2015 | Su |
| 2016/0351472 A1* | 12/2016 | Park ................... H01L 25/0657 |
| 2017/0018485 A1 | 1/2017 | Prabhu et al. |
| 2017/0018529 A1 | 1/2017 | Katkar et al. |
| 2019/0304992 A1* | 10/2019 | Baek ....................... H01L 24/69 |
| 2021/0028218 A1* | 1/2021 | Zhang ............... H01L 27/14643 |

* cited by examiner

S14210 depositing a conducting material layer on the second die farthest from the first die, the conducting material layer filling the connecting hole S14220 removing a portion of the conducting material layer outside the connecting hole

MULTILAYERED MEMORY DEVICE WITH THROUGH-SILICON VIA(TSV), SEMICONDUCTOR DEVICE AND METHOD FOR MANUFACTURING THE SAME

CROSS-REFERENCE TO RELATED APPLICATIONS

This application is a continuation application of International Patent Application No. PCT/CN2019/103363, filed on Aug. 29, 2019, which is based on and claims priority of the Chinese Patent Application No. 201811015659.9, filed on Aug. 31, 2018 and entitled "MEMORY DEVICE, SEMICONDUCTOR DEVICE AND METHOD FOR MANUFACTURING THE SAME," and Chinese Patent Application No. 201821428686.4, filed on Aug. 31, 2018 and entitled "MEMORY DEVICE AND SEMICONDUCTOR DEVICE." The above-referenced applications are incorporated herein by reference in their entirety.

TECHNICAL FIELD

This inventive concept relates generally to the field of semiconductor technologies and, more specifically, to a memory device, a semiconductor device and their manufacturing methods.

BACKGROUND

With rapid development in semiconductor technologies, die stacking technologies have been widely adopted in various types of memory devices, such as dynamic random access memory (DRAM) devices. Conventionally, Through-Silicon Vias (TSVs) may be used to connect multiple stacked dies in the shortest connection path. More specifically, in conventional technologies, silicon channels may first be formed in each of the to-be-stacked dies, and conductive components may be formed in these silicon channels. Then the dies may be stacked over each other so that the conductive components in the corresponding silicon channels are connected, thereby forming connected dies.

However, forming a TSV on each die individually may significantly prolong the manufacturing process and introduce additional procedures and cost therein.

It is to be noted that the above information disclosed in this Background section is only for facilitating the understanding of the background of this inventive concept and therefore may contain information that does not form the prior art that is already known to a person of ordinary skill in the art.

SUMMARY

In view of the limitations of existing technologies described above, this disclosure provides a memory device, a semiconductor device and related manufacturing methods that address at least some of the aforementioned limitations.

Additional features and advantages of this inventive concept will become apparent from the following detailed description or may be in part learned by practicing the inventive concept.

One aspect of this inventive concept is directed to a semiconductor device manufacturing method. The method may comprise: providing a first die and a plurality of second dies. The first die may have a first pad, and each of the plurality of second dies may having a second pad.

The method may further comprise: stacking the plurality of second dies on the first die, forming a connecting hole passing through the second dies, and forming a conductive body filling the connecting hole.

The second pads of the plurality of second dies and the first pad may be arranged in a stepwise manner, and projections of the second pads of any two adjacent second dies on the first die may be partially overlapped. The connecting hole may expose the first pad, and may comprise a plurality of hole sections each located one of the second dies. Each hole section may expose a portion of the second pad of the corresponding second die. The conductive body may connect the first pad and the second pads.

In some embodiments, the connecting hole may be formed by a single perforation process.

In some embodiments, the forming a connecting hole passing through the second dies may comprise: covering the second die farthest from the first die with a photoresist layer, exposing and developing the photoresist layer to form a developing area, etching the developing area toward the first pad until the first pad is exposed, and removing the photoresist layer. A projection of the developing area on the first die may overlap the first pad, and a portion of the second pad in the second die covered by the photoresist layer may be exposed in the developing area.

In some embodiments, the forming a conductive body filling the connecting hole and connecting the first pad and the second pads may comprise: forming an isolating layer on an inner wall of the connecting hole, the isolating layer not covering the first pad and surfaces of the second pads facing away from the first die; and forming a conductive body surrounded by the isolating layer. The conductive body may cover the first pad and the surfaces of the second pads not covered by the isolating layer.

In some embodiments, the forming an isolating layer on an inner wall of the connecting hole may comprise: forming an isolating material layer in the connecting hole, the isolating material layer covering surfaces of the first pad and the second pads within the connecting hole; and removing the portion of the isolating material layer on the first pad and on the surfaces of the second pads facing away from the first die.

In some embodiments, the forming a conductive body surrounded by the isolating layer may comprise: depositing a conducting material layer on the second die farthest from the first die, the conducting material layer filling the connecting hole; and removing the portion of the conducting material layer outside the connecting hole.

In some embodiments, the first pad and the second pads may each be made of a metallic material.

In some embodiments, the first pad and the second pads may each be made of any one of copper, aluminum and tungsten.

In some embodiments, the first die may comprise: a first substrate; and a first insulating layer disposed on the first substrate. The first pad may be embedded in a surface of the first insulating layer facing away from the first substrate. Each of the plurality of second dies may comprise: a second substrate; and a second insulating layer disposed on a surface of the second substrate facing away from the first die. The second pad in the second die may be embedded in a surface of the second insulating layer facing away from the second substrate. The second substrate of the second die closest to the first die may be disposed on the surface of the first insulating layer facing away from the first substrate, and the second substrates and the second insulating layers of the second dies may be stacked alternately one above another.

In some embodiments, the conductive body may be a Through-Silicon Via (TSV).

Another aspect of this inventive concept is directed to a semiconductor device. The semiconductor device may comprise: a first die having a first pad; a plurality of second dies each having a second pad and stacked on the first die; a connecting hole passing through the second dies; and a conductive body filling the connecting hole. The second pads of the plurality of second dies and the first pad may be arranged in a stepwise manner, and projections of the second pads of any two adjacent second dies on the first die may partially overlap. The connecting hole may expose the first pad and may comprise a plurality of hole sections each located in one of the second dies. Each hole section may expose a portion of the second pad of the corresponding second die. The conductive body may connect the first pad and the second pads.

In some embodiments, the aforementioned semiconductor device may further comprise an isolating layer disposed between an inner wall of the connecting hole and the conductive body. The isolating layer may not cover the first pad and surfaces of the second pads facing away from the first die.

In some embodiments, the first pad and the second pads may each be made of a metallic material.

In some embodiments, the first pad and the second pads may each be made of any one of copper, aluminum and tungsten.

In some embodiments, the first die may comprise: a first substrate; and a first insulating layer disposed on the first substrate. The first pad may be embedded in a surface of the first insulating layer facing away from the first substrate. Each of the second dies may comprise: a second substrate; and a second insulating layer disposed on a surface of the second substrate facing away from the first die. The second pad in the second die may be embedded in a surface of the second insulating layer facing away from the second substrate. The second substrate of the second die closest to the first die may be disposed on the surface of the first insulating layer facing away from the first substrate, and the second substrates and the second insulating layers of the second dies may be stacked alternately one above another.

In some embodiments, the conductive body may be a TSV.

Another aspect of this inventive concept is directed to a memory device. The memory device may comprise the semiconductor device of any of the aforementioned embodiments.

In the semiconductor device manufacturing method disclosed herein, a plurality of second dies may be stacked on the first die, the second pads of the plurality of second dies and the first pad may be arranged in a stepwise manner, and a connecting hole along a direction perpendicular to an upper surface of the first die and toward the first die may be formed. Hole sections of the connecting hole may expose a portion of the second pad of the corresponding second die, and the first die and the second dies may be connected through a conductive body formed in the connecting hole. Compared to conventional methods in which each die needs to be individually and separately perforated, the number of perforation procedures in this method may can be substantially reduced, which simplifies the manufacturing process, reduces the cost thereof, and improves the production yield.

In the memory device and the semiconductor device disclosed herein, since the second pads of the plurality of second dies and the first pad are arranged in a stepwise manner, and projections of the second pads of any two adjacent second dies on the first die are partially overlapped, the second dies may be stacked on the first die during the manufacturing process. Then a connecting hole may be formed along a direction perpendicular to an upper surface of the first die and toward the first die, and each hole section of the connecting hole may expose a portion of the second pad of the corresponding second die. The first die and the second dies may be connected through a conductive body formed in the connecting hold. Thus the second dies do not need to be individually and separately go through a perforation process, which may substantially reduce the number of perforation process needed in the manufacturing process. That may simplify the manufacturing process, reduce the cost thereof, and improve the production yield.

It is to be understood that both the foregoing general description and the following detailed description are exemplary and explanatory only and are not restrictive of this inventive concept.

BRIEF DESCRIPTION OF THE DRAWINGS

The accompanying drawings, which are incorporated in and constitute a part of the description, illustrate embodiments consistent with this disclosure and, together with the description, serve to explain the disclosed principles. It is apparent that these drawings present only some embodiments of this inventive concept and those of ordinary skill in the art may obtain drawings of other embodiments from them without exerting any creative effort.

LIST OF REFERENCE NUMERALS IN DRAWINGS

Figure 1:
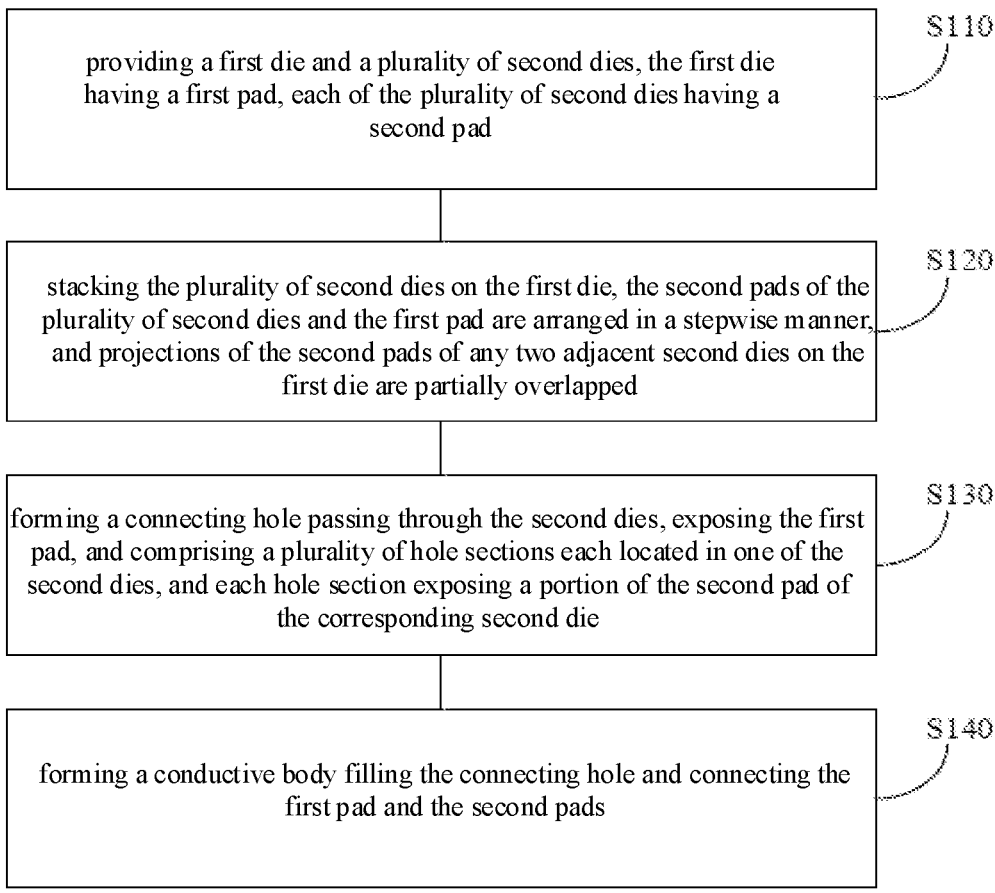
FIG. 1 is a flow diagram of a semiconductor device manufacturing method in accordance with one embodiment of this inventive concept.

1: a first die; 11: a first pad; 12: a first substrate; 13: a first insulating layer;
2: a second die; 21: a second pad; 22: a second substrate; 23: a second insulating layer;
3: a connecting hole; 4: a conductive body; 5: an isolating layer;
100: a photoresist layer; 101: a developing area; 200: a conducting material layer.

DETAILED DESCRIPTION OF THE EMBODIMENTS

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of the present invention and to fully convey the concepts of the exemplary embodiments to others skilled in the art. Throughout the figures, like reference numerals indicate identical or similar elements, so any duplicate description of them will be omitted.

Although relative terms such as "upper" and "lower" may be used herein to describe a spatial relationship of one component to another in a device shown in the figures, they are used merely for the purpose of easy description based on, for example, the exemplary orientation depicted in the figures. It is to be understood that if the illustrated device is turned upside down, then the component described as being "upper" will now be a "lower" component. When a certain structure is described as being "on" another structure, it is possible that the specific structure is either integrally formed on the other structure or disposed thereon "directly" or "indirectly" via an intermediate structure.

As used herein, the terms "a", "an" "the" and "said" are intended to mean that there are one or more elements/components/etc. As used herein, the terms "comprising" and "having" are intended to be used in an open-ended sense to mean that there are possibly other element(s)/component(s)/etc. apart from the listed element(s)/component(s)/etc. The terms "first", "second", etc. as used herein are meant as labels rather than place a quantitative limitation upon the amount of the mentioned items.

This inventive concept first provides a semiconductor device manufacturing method. Examples of the semiconductor device may include stacked dies such as dynamic random access memory (DRAM) devices, which will not be exhaustively enumerated herein.

FIG. 1 is a flow diagram of a semiconductor device manufacturing method in accordance with one embodiment of this inventive concept.

As shown in FIG. 1, the method may include steps S110 through S140.

In step S110, a first die and a plurality of second dies may be provided. The first die may have a first pad, and each of the plurality of second dies may have a second pad. In this application, a "die" (e.g., the first die or the second die) may refer to a semiconductor die on a wafer before the wafer is sliced, or a semiconductor die sliced from a wafer after the wafer is sliced. This inventive concept is not limited in this regard.

In step S120, the plurality of second dies may be stacked on the first die. The second pads of the plurality of second dies and the first pad may be arranged in a stepwise manner, and projections of the second pads of any two adjacent second dies on the first die may be partially overlapped. A projection of the second pad of the second die adjacent the first die on the first die may partially overlap the first pad.

In step S130, a connecting hole passing through the second dies may be formed. The connecting hole may expose the first pad, and may comprise a plurality of hole sections each located in one of the second dies. Each hole section may expose a portion of the second pad of the corresponding second die.

In step S140, a conductive body may be formed filling the connecting hole. The conductive body may connect the first pad and the second pads.

In the semiconductor device manufacturing method disclosed herein, the plurality of second dies may be stacked on the first die, and the second pads of the plurality of second dies and the first pad may be arranged in a stepwise manner. Then a connecting hole may be formed along a direction perpendicular to an upper surface of the first die and toward the first die. The connecting hole may comprise a plurality of hole sections each located in a corresponding second die, and each hole section may expose a portion of the second pad of the corresponding second die. More specifically, each hole section may expose a portion of a side surface of the second pad of the corresponding second die. Each hole section may also expose a portion of an upper surface of the second pad of the second die directly underneath the corresponding second die. The first die and the second dies may be connected through a conductive body formed in the connecting hole. Compared to conventional methods in which the dies need to be individually and separately perforated, the number of perforation processes in this method may can be substantially reduced, which simplifies the manufacturing process, reduces the cost thereof, and improves the production yield.

The steps of the method will be described in greater details below.

Figure 2:
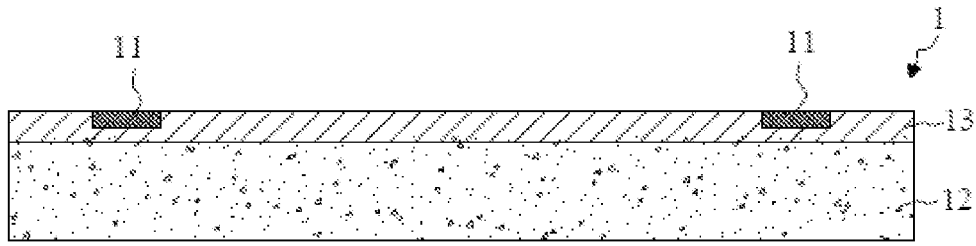
FIG. 2 is a schematic diagram of a first die in a semiconductor device manufacturing method in accordance with one embodiment of this inventive concept.
Figure 3:
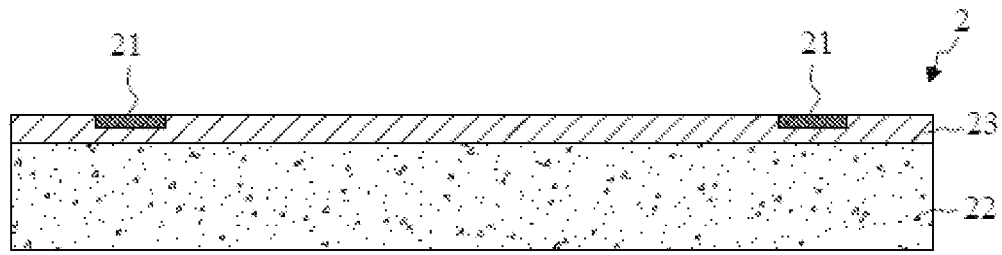
FIG. 3 is a schematic diagram of a second die in a semiconductor device manufacturing method in accordance with one embodiment of this inventive concept.
Figure 4:
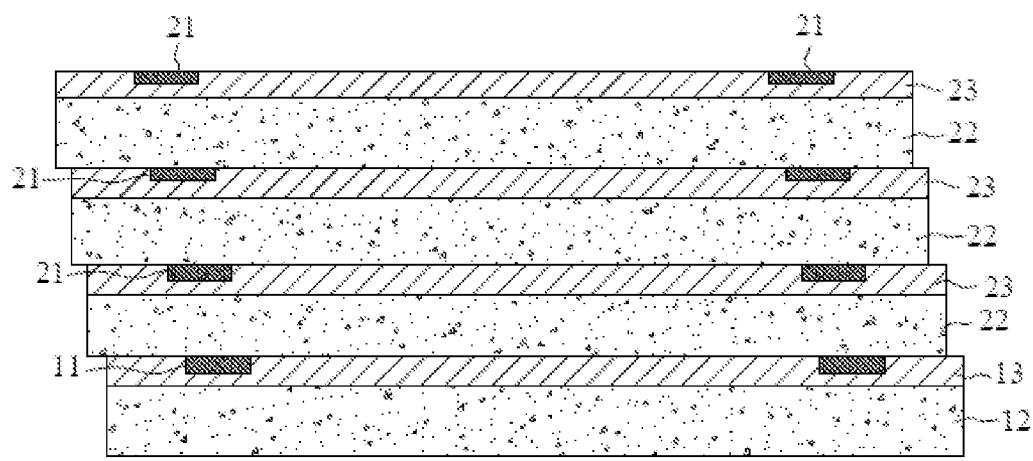
FIG. 4 is a schematic diagram illustrating a structure after step S120 in a semiconductor device manufacturing method in accordance with one embodiment of this inventive concept.

Referring to FIGS. 2, 3, and 4, in step S110, the first die 1 and the second die 2 may be provided. The number of the first die 1 provided may be one. The first die 1 may have a first pad 11, which may be coupled to electrical circuits on the first die 1.

In one example, as shown in FIG. 2, the first die 1 may include the first pad 11, a first substrate 12 and a first insulating layer 13.

The first substrate 12 may be made of silicon or any other suitable semiconductor material, and may have any suitable shape and size. This inventive concept is not limited in these regards.

The first insulating layer 13 may be located on the first substrate 12 and may be made of a material such as silica or silicon nitride, or of a mixture of several insulating materials.

The first pads 11 may be provided on a surface of the first insulating layer 13 facing away from the first substrate 12. The first pad 11 may be embedded in the first insulating layer 13, with an upper surface of the first pad 11 flush with the surface of the first insulating layer 13 facing away from the first substrate 12. The first pad 11 may be made of a metallic material such as copper, aluminum or tungsten. Apparently, the first pad 11 may also be made of other suitable metallic materials, which will not be exhaustively enumerated herein. The first pad 11 may have a rectangular shape in a plan view. The first pad 11 may also have a circular shape or other shapes in a plan view. The first pad 1 may have one or more first pads 11.

As shown in FIG. 3, the number of the second dies 2 provided may be more than one, that is, a plurality of second dies 2 may be provided. Each of the plurality of second dies 2 may have a second pad 21. For example, the second die 2 may have the second pad 21, a second substrate 22 and a second insulating layer 23. The second substrate 22 may be made of the same material as the first substrate 12.

The second insulating layer 23 may be disposed on the second substrate 22 and may be made of the same material as the first insulating layer 13.

The second pad 21 may be disposed on the surface of the second insulating layer 23 facing away from the second substrate 22. The second pad 21 may be embedded in the second insulating layer 23, with an upper surface of the second pad 21 flush with the surface of the second insulating layer 23 facing away from the second substrate 22. The second pad 21 may be made of a metallic material such as copper, aluminum or tungsten. Apparently, the second pad 21 may also be made of other metallic materials not enumerated herein. The second pad 11 may be rectangular, circular or other shapes in a plan view. The number of second pads 21 in each second die 2 may be equal to the number of first pads 11 in the first die 1. That is, each second pad in a second die 2 may correspond to a first pad 11 in the first die 1.

As shown in FIG. 4, in step S120, the plurality of second dies 2 may be stacked on the first die 1. The second pads 21 of the plurality of second dies 2 and the first pad 11 may be arranged in a stepwise manner, and projections of the second pads 21 of any two adjacent second dies 2 on the first die 1 may be partially overlapped.

Figure 15:
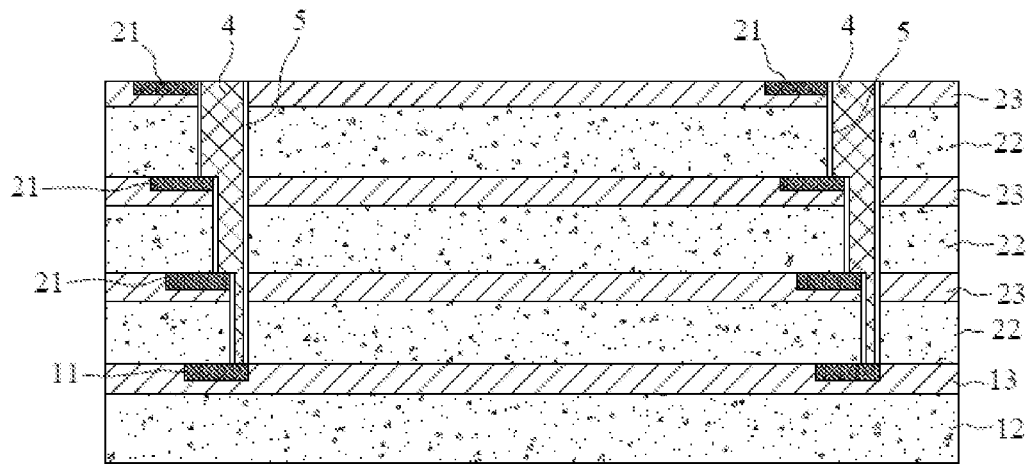
FIG. 15 is a schematic diagram illustrating a semiconductor device in accordance with another embodiment of this inventive concept.

The second dies 2 may be stacked successively onto the first die 1, thus forming a stacked structure. During the successive stacking process, two adjacent dies, such as the first die 1 and the second die 2 stacked directly on the first die 1, and two adjacent second dies 2, may be bonded together. For example, the second insulating layers 23 and the second substrates 22 may be alternately stacked on the surface of the first insulating layer 13 facing away from the first substrate 12, with the second substrate 22 of the second die 2 closest to the first die 1 bonded to the surface of the first insulating layer 13 facing away from the first substrate 12. In any two adjacent second dies 2, the second insulating layer 23 of the underlying second die 2 may be boned to the second substrate 22 of the overlying second die 2. In some embodiments, each of the second dies 2 and the first die 1 may have the same shape and size, but the position of the second pad 21 on each of the second dies 2 may be different. The second dies 2 may be aligned with the first die 1, that is, their edges may be aligned. As the positions of the second pads 21 of different second dies 2 are different, these second pads 21 may be arranged in a stepwise manner so as to form the semiconductor device as shown in FIG. 15.

If each of the second dies 2 has a plurality of second pads 21, the first die 1 may have a plurality of first pads 11, a plurality of pad sets (comprising a first pad 11 and corresponding second pads 21) each having a stepwise pad arrangement may be formed. Relevant parts in the aforementioned embodiments may be referred to for the method to form the stepwise pad arrangement, which will not be repeatedly described in details herein. Two pad sets that have the stepwise pad arrangement may be symmetrically mirrored to each other, such as those shown in FIG. 16. Apparently, two pad sets having the stepwise pad arrangement may also be arranged identically along a same direction (e.g., as shown in FIG. 15).

As shown in FIG. 1, in step S130, a connecting hole 3 passing through the second dies 2 may be formed. The connecting hole 3 may expose the first pad 11, and may comprise a plurality of hole sections each located in one of the second dies 2. Each hole section may expose a portion of the second pad 21 of the corresponding second die 2.

The connecting hole 3 may be formed by, for example, etching in a single perforation step. Apparently, the connecting hole 3 may also be formed through multiple perforation processes, but the number of the perforation processes conducted may be less than the number of second dies 2. Compared to conventional methods in which each die needs to be separately and individually perforated, the number of perforation processes in this method may be substantially reduced, which simplifies the manufacturing process and reduces the cost thereof.

Figure 5:
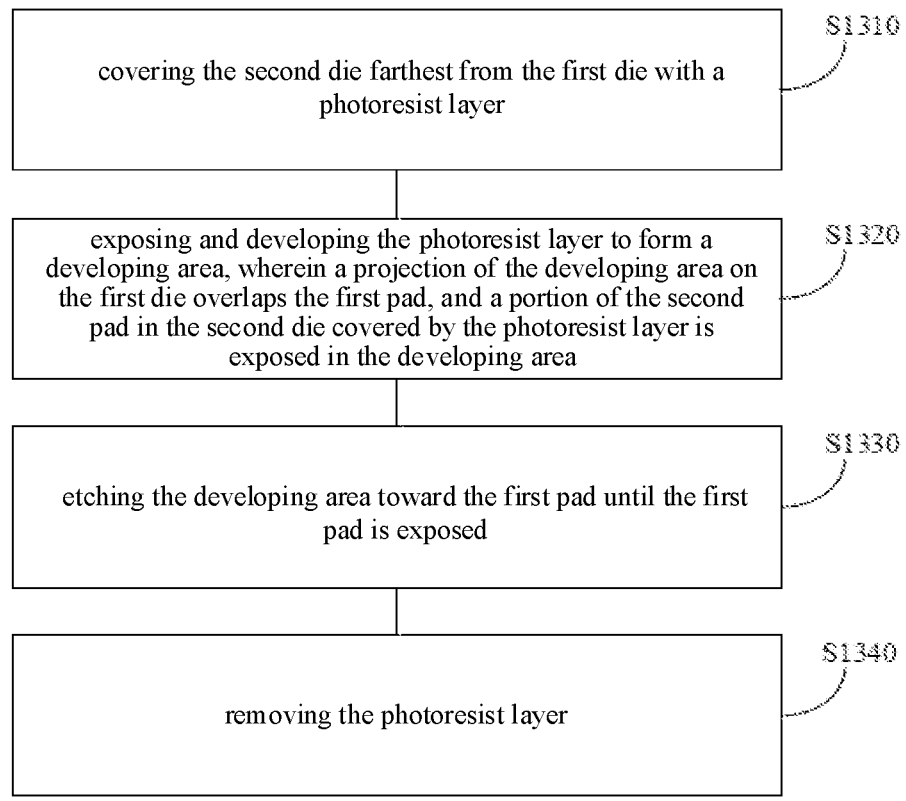
FIG. 5 is a flow diagram of step S130 in a semiconductor device manufacturing method in accordance with one embodiment of this inventive concept.

In some embodiments, as shown in FIG. 5, step S130 may further include steps S1310 through S1340.

In step S1310, the second die 2 farthest from the first die 1 may be covered with a photoresist layer 100.

The photoresist layer 100 may be a positive photoresist or a negative photoresist. This inventive concept is not limited in this regard.

Figure 6:
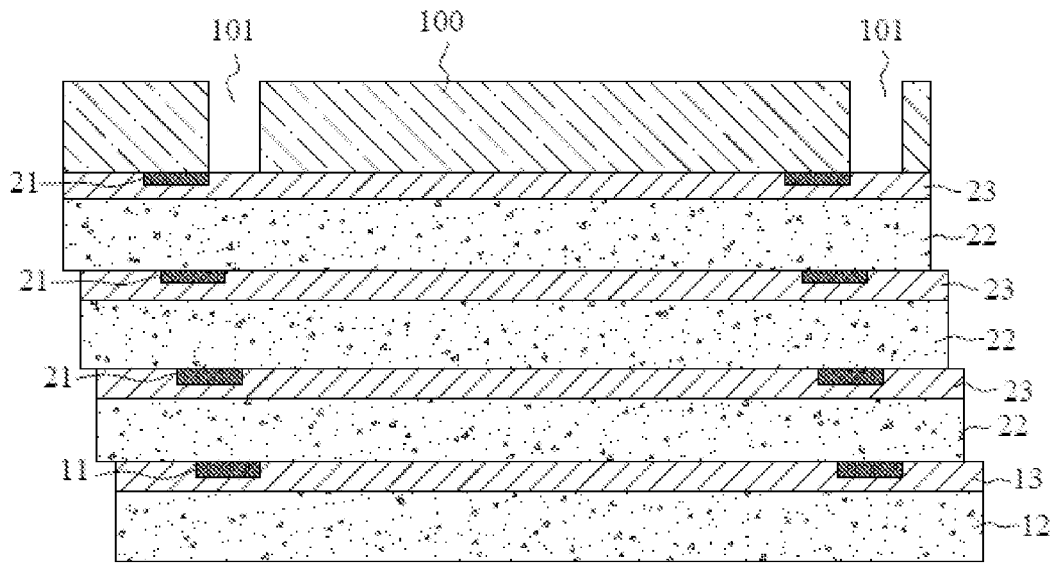
FIG. 6 is a schematic diagram illustrating a structure after step S1320 in a semiconductor device manufacturing method in accordance with one embodiment of this inventive concept.

As shown in FIG. 6, in step S1320, the photoresist layer 100 may be exposed and developed to form a developing area 101. A projection of the developing area 101 on the first die 1 may overlap the first pad 11, and a portion of the second pad 21 in the second die covered by the photoresist layer 100 may be exposed in the developing area 101.

The photoresist layer 100 may be exposed and developed with the aid of a photomask to form the developing area 101. The developing area 101 may be aligned with the first die 1, and the projection of the developing area 101 on the first die 1 may overlap the first pad 11. Since the second pads 21 and the first pad 11 are arranged in a stepwise manner, the developing area 101 may expose a portion of the second pad 21 in the second die 2 covered by the photoresist layer 100, that is, a portion of the second pad 21 in the second die 2 farthest from the first die 1 may be exposed.

In step S1330, the developing area 101 may be etched toward the first pad 11 until the first pad 11 is exposed.

The etching process performed in the portion of the second die 2 exposed by the developing area 101 may be a dry etching process, which may proceed gradually toward the first pads 11 aligned with the developing area 101 until the first pad 11 is exposed. Thus, a connecting hole 3 can be formed through one single etching process. Since the first pad 11 and the second pads 21 may both be made of copper, which will not be removed by the drying etching process, only other materials aligned with the developing area 101 will be removed. Apparently, other suitable etching methods may be used to form the connecting hole 3, and this inventive concept is not limited in this regard.

Figure 7:
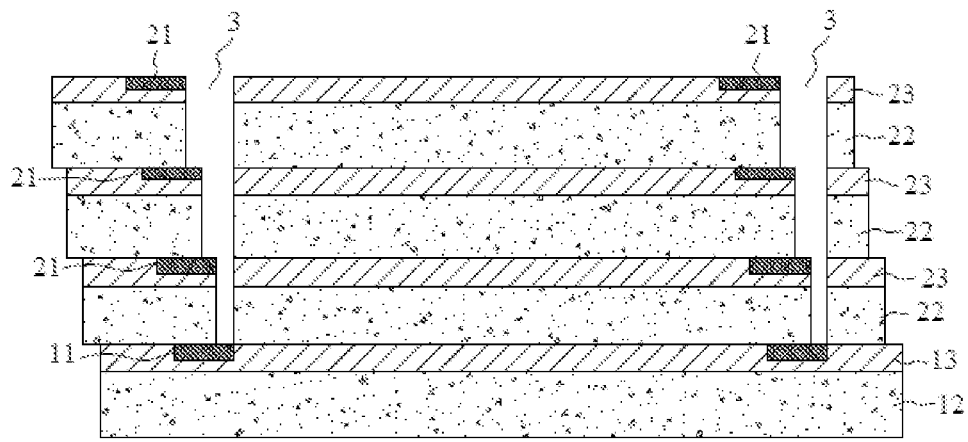
FIG. 7 is a schematic diagram illustrating a structure after step S1340 in a semiconductor device manufacturing method in accordance with one embodiment of this inventive concept.

The connecting hole 3 may comprise a plurality of hole sections each located in one of the second dies 2. Each hole section may expose a portion of the second pad 21 of the corresponding second die 2. Since the second pads 21 and the first pad 11 are arranged in a stepwise manner and the pads will not be removed by the etching process, the sizes of the respective hole sections may be different, which may gradually decrease toward the exposed first pad 11. That is, a size of a cross section of the connecting hole 3 parallel with the upper surface of the first pad 11 may gradually decrease while the cross section moving toward the first pad 11. As shown in FIG. 7, a first side of an inner wall of the connecting hole 3 close to the second pads 21 may comprises a stepwise arrangement, and a second side of the inner wall may comprise a flatly extending structure.

As shown in FIG. 7, in step S1340, the photoresist layer 100 may be removed.

The photoresist layer 100 may be removed by using a stripping solution, an ashing process or any other suitable techniques, and this inventive concept is not limited in this regard.

As shown in FIG. 1, in step S140, a conductive body 4 may be formed filling the connecting hole 3. The conductive body 4 may connect the first pad 11 and the second pads 21.

The conductive body 4 may be made of a metallic material such as copper, aluminum or tungsten. Apparently, the conductive body 4 may also be made of any other suitable metallic material not enumerated herein. To ensure that the conductive body 4 has a same conductivity characteristic as the first pad 11 and the second pads 21, the conductive body 4 may be made of the same material as the first pad 11 and the second pads 21. For example, the conductive body 4, the first pad 11, and the second pads 21 may all be made of copper. The conductive body 4 may connect the first pad 11 and the second pads 21 having a stepwise arrangement, thereby achieving a connection between the first die 1 and the second dies 2.

Figure 8:
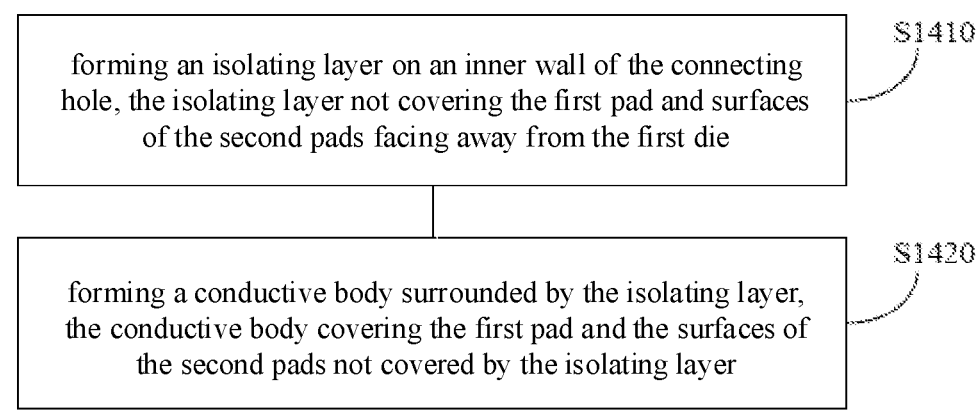
FIG. 8 is a flow diagram of step S140 in a semiconductor device manufacturing method in accordance with one embodiment of this inventive concept.

In some embodiments, as shown in FIG. 8, step S140 may include steps S1410 and S1420.

In step S1410, an isolating layer 5 may be formed on an inner wall of the connecting hole 3. The isolating layer 5 may not cover the first pad 11 and surfaces of the second pads 21 facing away from the first die 1.

The isolating layer 5 may consist of a single layer of silica, silicon nitride or any other suitable insulating material. Apparently, the isolating layer 5 may also consist of multiple layers. For example, the isolating layer 5 may consist of an insulating layer and a barrier layer. The insulating layer may be directly formed on the inner wall of the connecting hole 3 and a barrier layer may be formed on an inner wall of the insulating layer. The barrier layer may prevent outward diffusion of the conductive body 4 and therefore may improve electrical reliability and stability of the dies. The material of the barrier layer may depend on the material of the conductive body 4. For example, when the conductive body 4 is formed of copper, the material of the barrier layer may be titanium, tantalum or any other suitable material that can provide the aforementioned barrier function.

In some embodiments, the isolating layer 5 may be a single-layer structure.

Figure 9:
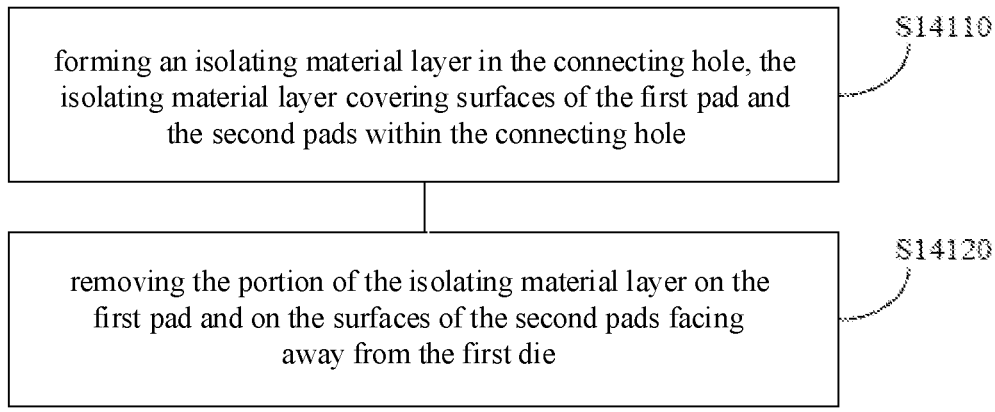
FIG. 9 is a flow diagram of step S1410 in a semiconductor device manufacturing method in accordance with one embodiment of this inventive concept.

In some embodiments, as shown in FIG. 9, step S1410 may include steps S14110 and S14120.

Figure 10:
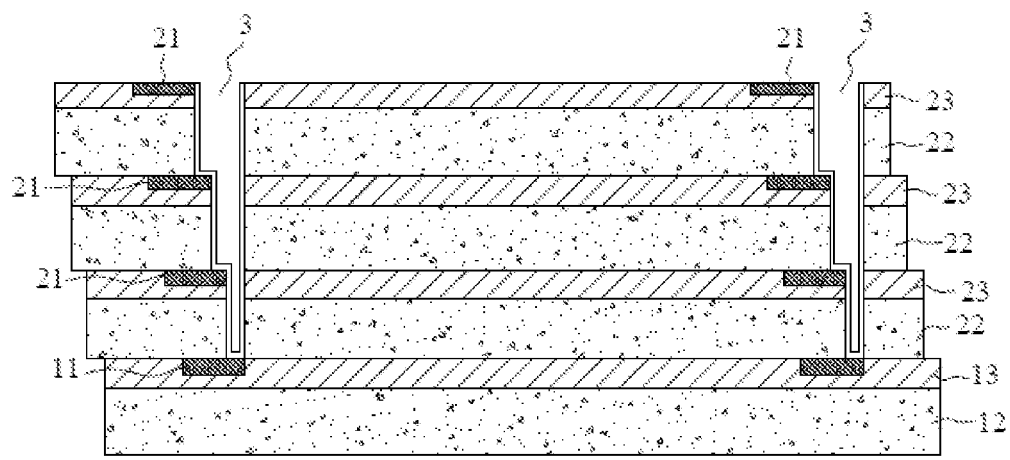
FIG. 10 is a schematic diagram illustrating a structure after step S14110 in a semiconductor device manufacturing method in accordance with one embodiment of this inventive concept.

As shown in FIGS. 9 and 10, in step S14110, an isolating material layer may be formed in the connecting hole 3. The isolating material layer may cover surfaces of the first pad 11 and the second pads 21 within the connecting hole 3.

The isolating material layer may be made of silica. In this case, silica may be deposited on the second insulating layer 23 of the second die 2 that is farthest from the first die 1. The isolating material layer may be deposited in the connecting hole 3 and may cover surfaces of the first pad 11 and the second pads 21 within the connecting hole 3 so that the inner wall of the connecting hole 3 is completely covered.

Figures 11, 12:
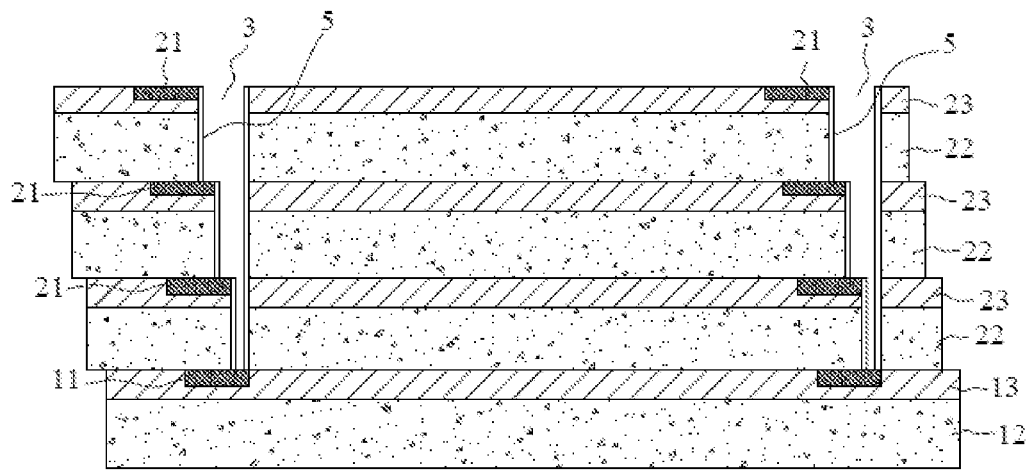
FIG. 11 is a schematic diagram illustrating a structure after step S14120 in a semiconductor device manufacturing method in accordance with one embodiment of this inventive concept.
FIG. 12 is a flow diagram of step S1420 in a semiconductor device manufacturing method in accordance with one embodiment of this inventive concept.

As shown in FIG. 11, in step S14120, the portion of the isolating material layer on the first pad 11 and on the surfaces of the second pads 21 facing away from the first die 1 may be removed.

The portion of the isolating material layer covering the first pad 11 may be removed with an etchant solution so that at least part of the first pad 11 is exposed, and the conductive body 4 may be connected with the first pad 11. Meanwhile, the portion of the isolating material layer deposited on the surfaces of the second pads 21 facing away from the first die 1 may be removed, so as to expose surfaces of the second pads 21 facing away from the first die 1 in the connecting hole 3, thereby allowing the conductive body 4 to connect the respective second pads 21.

As shown in FIG. 8, in step S1420, a conductive body 4 surrounded by the isolating layer 5 may be formed. The conductive body 4 may cover the first pad 11 and the surfaces of the second pads 21 not covered by the isolating layer 5.

The space delimited by the isolating layer 5 may be filled with a conducting material. The conducting material may cover the exposed portions of the first pad 11 and the second pads 21 so as to form the conductive body 4. The resulting conductive body 4 may have a shape matched with the connecting hole 3.

In some embodiments, as shown in FIG. 12, step S1420 may include steps S14210 and S14220.

Figure 13:
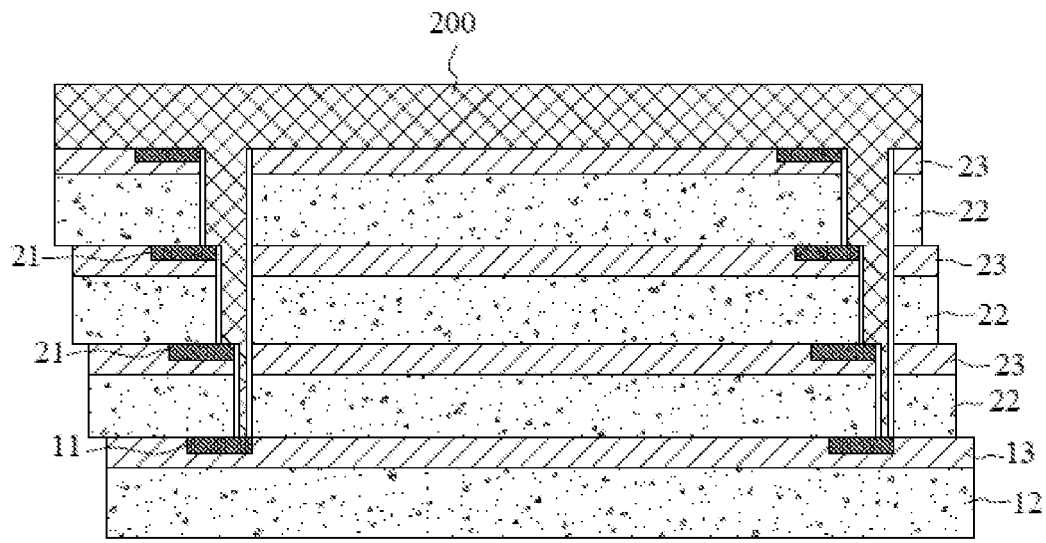
FIG. 13 is a schematic diagram illustrating a structure after step S14210 in a semiconductor device manufacturing method in accordance with one embodiment of this inventive concept.

As shown in FIG. 13, in step S14210, the second die 2 farthest from the first die 1 may be covered with a conducting material layer 200, the conducting material layer 200 may fill the connecting hole 3.

The conducting material layer 200 may be formed by sputtering, electroplating, evaporation or any other suitable process, and this inventive concept is not limited in this regard. The portion of the conducting material layer 200 within the connecting hole 3 may cover the exposed surfaces of the first pad 11 and the second pads 21 so that the first pad 11 and the second pads 21 are connected through the conducting material layer 200.

As shown in FIG. 12, in step S14220, the portion of the conducting material layer 200 outside the connecting hole 3 may be removed.

The removal of the portion of the conducting material layer 200 outside the connecting hole 3 may be accomplished by chemical mechanical polishing or other suitable methods so that the remaining of the conducting material layer 200 within the connecting hole 3 forms the conductive body 4. The conductive body 4 may cover the second pad 21 of the second die 2 farthest from the first die 1.

Figure 14:
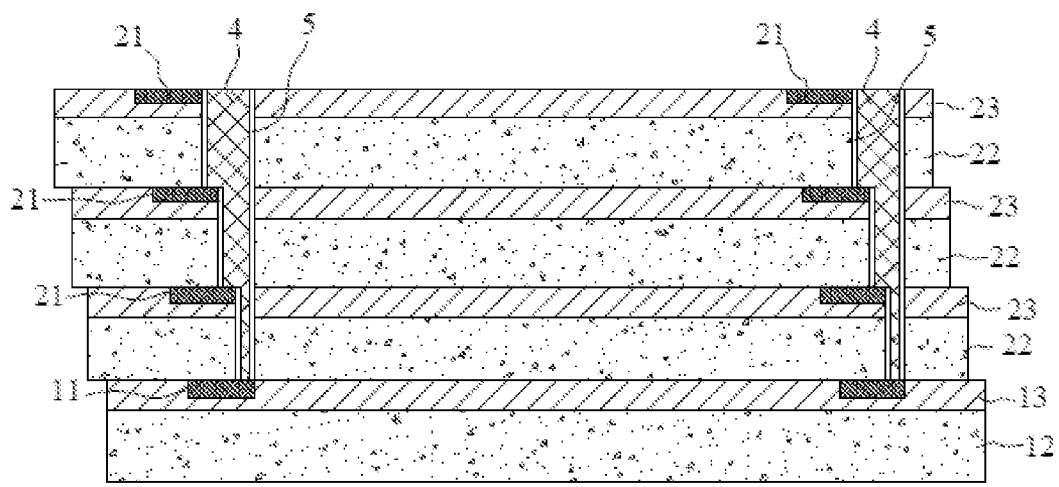
FIG. 14 is a schematic diagram illustrating a semiconductor device in accordance with one embodiment of this inventive concept.

This inventive concept further provides a semiconductor device. The semiconductor device may include a first die 1, second dies 2, a connecting hole 3 and a conductive body 4, as shown in FIG. 14.

The first die 1 may have a first pad 11.

The number of the second dies 2 may be more than one, and each of the second dies 2 may have a second pad 21. The second dies 2 may be stacked on the first die 1. The second pads 21 of the plurality of second dies 2 and the first pad 11 may be arranged in a stepwise manner, and projections of the second pads 21 of any two adjacent second dies 2 on the first die 1 may be partially overlapped.

The connecting hole 3 may pass through the second dies 2 and may expose the first pad 11. The connecting hole 3 may include a plurality of hole sections each located in one of the second dies 2, and each hole section may expose a portion of the second pad 21 of the corresponding second die 2.

The conductive body 4 may be formed in the connecting hole 3 to connect the first pad 11 and the second pads 21.

Figure 16:
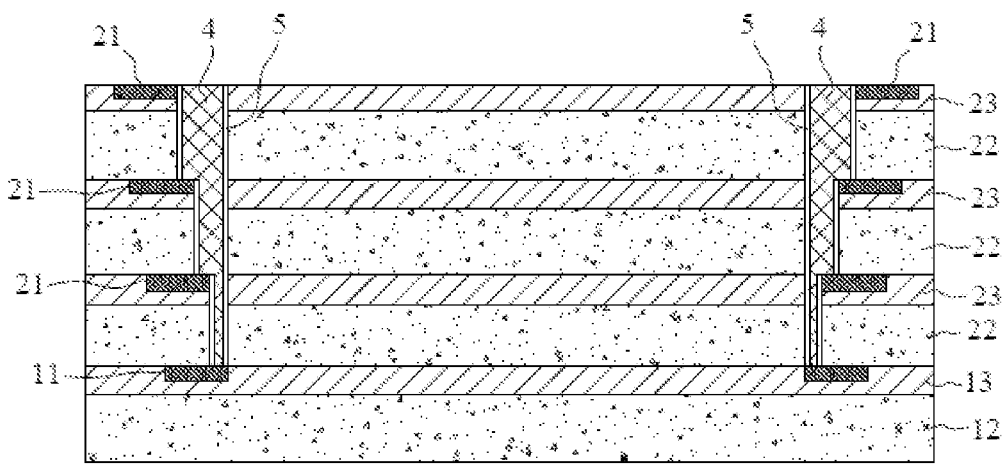
FIG. 16 is a schematic diagram illustrating a semiconductor device in accordance with yet another embodiment of this inventive concept.

FIG. 15 is a schematic diagram illustrating a semiconductor device in accordance with another embodiment of this inventive concept. FIG. 16 is a schematic diagram illustrating a semiconductor device in accordance with yet another embodiment of this inventive concept.

In the semiconductor device disclosed herein, since the second pads 21 of the plurality of second dies 2 and the first pad 11 are arranged in a stepwise manner, and projections of the second pads 21 of any two adjacent second dies 2 on the first die 1 are partially overlapped, the second dies 2 can be stacked on the first die 1 during the manufacturing process. Then a connecting hole 3 may be formed along a direction perpendicular to an upper surface of the first die 1 and toward the first die 1. The connecting hole 3 may comprise a plurality of hole sections, each hole section of the connecting hole 3 may expose a portion of the second pad 21 of the corresponding second die 2, and the first die 1 and the second dies 2 may be connected through a conductive body 4 formed in the connecting hole 3. Thus the second dies 2 do not need to be separately and individually perforated, and the number of required perforation processed may be substantially reduced, which simplifies the manufacturing process, reduces the cost thereof, and improves the production yield.

In some embodiments, the semiconductor device may further include an isolating layer 5 disposed between an inner wall of the connecting hole 3 and the conductive body 4. The isolating layer 5 may not cover the first pad 11 and the surfaces of the second pads 21 facing away from the first die 1.

As the various components of the semiconductor device have been described in details hereinabove in connection with the description of the semiconductor device manufacturing method, a further detailed description thereof is therefore omitted for the sake of concision.

This inventive concept further provides a memory device incorporating the semiconductor device of any of the aforementioned embodiments. The memory device may be a DRAM, NAND flash memory or the like.

Other embodiments of the present disclosure will be apparent to those skilled in the art from considering the specification and practicing the invention disclosed herein. Accordingly, this disclosure is intended to cover all and any variations, uses, or adaptations of the disclosure which follow, in general, the principles thereof and include such departures from the present disclosure as come within common knowledge or customary practice within the art to which the invention pertains. It is also intended that the specification and examples be considered as exemplary only, with true scope and spirit of the disclosure being indicated by the appended claims.

The invention claimed is:

1. A semiconductor device manufacturing method, comprising:
   providing a first die and a plurality of second dies, the first die having a first pad, each of the plurality of second dies having a second pad, wherein the first die comprises:
      a first substrate; and
      a first insulating layer disposed on the first substrate, wherein the first pad is embedded in a surface of the first insulating layer facing away from the first substrate, and wherein each of the plurality of second dies comprises:
      a second substrate; and
      a second insulating layer disposed on a surface of the second substrate facing away from the first die, wherein the second pad in the second die is embedded in a surface of the second insulating layer facing away from the second substrate, and
      wherein the second substrate of the second die closest to the first die is disposed on the surface of the first insulating layer facing away from the first substrate, the second substrates and the second insulating layers of the second dies are stacked alternately one above another;
   stacking the plurality of second dies on the first die, the second pads of the plurality of second dies and the first pad arranged in a stepwise manner, and projections of the second pads of any two adjacent second dies on the first die partially overlapped;
   forming a connecting hole passing through the second dies, the connecting hole exposing the first pad, and comprising a plurality of hole sections each located in one of the second dies, and each hole section exposing a portion of the second pad of the corresponding second die; and
   forming a conductive body filling the connecting hole and connecting the first pad and the second pads.

2. The method of claim 1, wherein the connecting hole is formed by a single perforation process.

3. The method of claim 2, wherein the forming a connecting hole passing through the second dies comprises:
   covering the second die farthest from the first die with a photoresist layer;
   exposing and developing the photoresist layer to form a developing area, wherein a projection of the developing area on the first die overlaps the first pad, and a portion of the second pad in the second die covered by the photoresist layer is exposed in the developing area;
   etching the developing area toward the first pad until the first pad is exposed; and
   removing the photoresist layer.

4. The method of claim 1, wherein the forming a conductive body filling the connecting hole and connecting the first pad and the second pads comprises:
   forming an isolating layer on an inner wall of the connecting hole, the isolating layer not covering the first pad and surfaces of the second pads facing away from the first die; and
   forming a conductive body surrounded by the isolating layer, the conductive body covering the first pad and the surfaces of the second pads not covered by the isolating layer.

5. The method of claim 4, wherein the forming an isolating layer on an inner wall of the connecting hole comprises:
   forming an isolating material layer in the connecting hole, the isolating material layer covering surfaces of the first pad and the second pads within the connecting hole; and removing the portion of the isolating material layer on the first pad and on the surfaces of the second pads facing away from the first die.

6. The method of claim 4, wherein the forming a conductive body surrounded by the isolating layer comprises:
depositing a conducting material layer on the second die farthest from the first die, the conducting material layer filling the connecting hole; and
removing the portion of the conducting material layer outside the connecting hole.

7. The method of claim 1, wherein the first pad and the second pads are each made of a metallic material.

8. The method of claim 7, wherein the first pad and the second pads are each made of any one of copper, aluminum and tungsten.

9. The method of claim 1, wherein the conductive body is a Through-Silicon Via (TSV).

10. A semiconductor device, comprising:
a first die having a first pad, wherein the first die comprises:
a first substrate; and
a first insulating layer disposed on the first substrate, wherein the first pad is embedded in a surface of the first insulating layer facing away from the first substrate;
a plurality of second dies each having a second pad, the second dies stacked on the first die, the second pads of the plurality of second dies and the first pad arranged in a stepwise manner, and projections of the second pads of any two adjacent second dies on the first die partially overlapped, wherein each of the plurality of second dies comprises:
a second substrate; and
a second insulating layer disposed on a surface of the second substrate facing away from the first die, wherein the second pad in the second die is embedded in a surface of the second insulating layer facing away from the second substrate, and
wherein the second substrate of the second die closest to the first die is disposed on the surface of the first insulating layer facing away from the first substrate, the second substrates and the second insulating layers of the second dies are stacked alternately one above another;
a connecting hole passing through the second dies, the connecting hole exposing the first pad, and comprising a plurality of hole sections each located in one of the second dies, and each hole section exposing a portion of the second pad of the corresponding second die; and
a conductive body filling the connecting hole and connecting the first pad and the second pads.

11. The semiconductor device of claim 10, further comprising:
an isolating layer disposed between an inner wall of the connecting hole and the conductive body, and the isolating layer not covering the first pad and surfaces of the second pads facing away from the first die.

12. The semiconductor device of claim 11, wherein the first pad and the second pads are each made of a metallic material.

13. The semiconductor device of claim 12, wherein the first pad and the second pads are each made of any one of copper, aluminum and tungsten.

14. The semiconductor device of claim 10, wherein the conductive body is a Through-Silicon Via (TSV).

15. A memory device, comprising the semiconductor device of claim 10.

16. A semiconductor device manufacturing method, comprising:
providing a first die and a plurality of second dies, the first die having a first pad, each of the plurality of second dies having a second pad;
stacking the plurality of second dies on the first die, the second pads of the plurality of second dies and the first pad arranged in a stepwise manner, and projections of the second pads of any two adjacent second dies on the first die partially overlapped;
forming a connecting hole passing through the second dies, the connecting hole exposing the first pad, and comprising a plurality of hole sections each located in one of the second dies, and each hole section exposing a portion of the second pad of the corresponding second die; and
forming a conductive body filling the connecting hole and connecting the first pad and the second pads,
wherein the connecting hole is formed by a single perforation process, and wherein the forming a connecting hole passing through the second dies comprises:
covering the second die farthest from the first die with a photoresist layer;
exposing and developing the photoresist layer to form a developing area, wherein a projection of the developing area on the first die overlaps the first pad, and a portion of the second pad in the second die covered by the photoresist layer is exposed in the developing area;
etching the developing area toward the first pad until the first pad is exposed; and
removing the photoresist layer.

17. The method of claim 16, wherein the first pad and the second pads are each made of a metallic material.

18. The method of claim 17, wherein the first pad and the second pads are each made of any one of copper, aluminum and tungsten.

19. The method of claim 16, wherein the conductive body is a Through-Silicon Via (TSV).

20. The method of claim 16, wherein the forming a conductive body filling the connecting hole and connecting the first pad and the second pads comprises:
forming an isolating layer on an inner wall of the connecting hole, the isolating layer not covering the first pad and surfaces of the second pads facing away from the first die; and
forming a conductive body surrounded by the isolating layer, the conductive body covering the first pad and the surfaces of the second pads not covered by the isolating layer.

* * * * *